United States Patent [19]
Sakaki et al.

[11] Patent Number: 5,323,535
[45] Date of Patent: Jun. 28, 1994

[54] ELECTRICAL CONNECTING MEMBER AND METHOD OF MANUFACTURING THE SAME

[75] Inventors: Takashi Sakaki, Tokyo; Tetsuo Yoshizawa, Yokohama; Toyohide Miyazaki, Ibaraki; Hiroshi Kondo, Yokohama; Yoshimi Terayama, Odawara; Yuichi Ikegami, Osaka; Takahiro Okabayashi, Tokyo; Kazuo Kondo, Tokyo; Yoichi Tamura, Tokyo; Yasuo Nakatsuka, Tokyo, all of Japan

[73] Assignees: Canon Kabushiki Kaisha, Tokyo; Sumitomo Metal Industries Ltd., Osaka, both of Japan

[21] Appl. No.: 26,103

[22] Filed: Mar. 1, 1993

Related U.S. Application Data

[63] Continuation of Ser. No. 840,946, Feb. 25, 1992, abandoned.

[30] Foreign Application Priority Data

| Feb. 25, 1991 | [JP] | Japan | 3-53905 |
| Mar. 9, 1991 | [JP] | Japan | 3-69090 |
| Mar. 26, 1991 | [JP] | Japan | 3-87597 |
| Mar. 28, 1991 | [JP] | Japan | 3-91638 |

[51] Int. Cl.$^5$ ............................................. H01K 3/10
[52] U.S. Cl. .................................. 29/852; 29/424; 29/829; 29/848; 156/307.3; 437/209
[58] Field of Search ............... 29/424, 829, 851, 848; 156/307.3

[56] References Cited

U.S. PATENT DOCUMENTS

| 2,961,746 | 11/1960 | Lyman | 29/848 |
| 4,067,104 | 1/1978 | Tracy | 29/424 X |
| 4,249,302 | 2/1981 | Crepeau | 428/901 X |
| 4,612,083 | 9/1986 | Yasumoto et al. | 156/307.3 X |
| 4,799,984 | 1/1989 | Rellick | 29/829 X |
| 4,806,188 | 2/1989 | Rellick | 29/851 X |
| 4,826,549 | 5/1990 | Yoshizawa et al. | 29/876 |
| 4,949,455 | 8/1990 | Nakamura et al. | 29/843 |
| 5,058,800 | 10/1991 | Yoshizawa et al. | 228/180 |

FOREIGN PATENT DOCUMENTS

| 256778 | 2/1988 | European Pat. Off. |
| 0327399 | 8/1989 | European Pat. Off. |
| 0344720 | 12/1989 | European Pat. Off. |
| 42-2096 | 1/1967 | Japan |
| 59-139636 | 8/1984 | Japan |

(List continued on next page.)

OTHER PUBLICATIONS

L. S. Goldmann, "Geometric Optimization of Controlled Collapse Interconnections", IBM Journal of Research and Development, Index vol. 13, pp. 251–265 (May 1969).

K. D. Norris, et al., "Reliability of Controlled Collapse Interconnections," IBM Journal of Research and Development Index vol. 13, pp. 266–271 (May 1969).

Primary Examiner—Carl J. Arbes
Attorney, Agent, or Firm—Fitzpatrick, Cella, Harper, & Scinto

[57] ABSTRACT

A method of manufacturing an electrical connecting member having a holding member formed of an electrically insulative material, and a plurality of electrically conductive members provided in a mutually insulated state in the holding member, one end of each of the electrically conductive members being exposed on one surface of the holding member and the other end of each of the electrically conductive members being exposed on the other surface of the holding member, includes the steps of providing photosensitive resin which provides the holding member on a base body, applying light to the photosensitive resin through a photomask forming a predetermined pattern to thereby expose the photosensitive resin to the light, developing the photosensitive resin to form a plurality of apertures in the photosensitive resin, thereby exposing the base body, leaving the photosensitive resin through which the base body has been exposed in a heated atmosphere and/or a negative pressure atmosphere for a predetermined time, etching the exposed portions of the base body to thereby form recesses communicating with the apertures, filling the apertures and the recesses with an electrically conductive material which provides the electrically conductive members, and removing the remaining portions of the base body.

37 Claims, 19 Drawing Sheets

FOREIGN PATENT DOCUMENTS

| | | |
|---|---|---|
| 60-057944 | 4/1985 | Japan . |
| 60-216411 | 10/1985 | Japan . |
| 61-78069 | 4/1986 | Japan . |
| 61-141157 | 6/1986 | Japan . |
| 61-174643 | 8/1986 | Japan . |
| 61-272941 | 12/1986 | Japan .................................... 437/209 |
| 62-175446 | 7/1988 | Japan . |
| 63-222437 | 9/1988 | Japan . |
| 63-224235 | 9/1988 | Japan . |
| 1-205595 | 8/1989 | Japan . |
| 0249385 | 2/1990 | Japan . |
| 91-07073 | 5/1991 | World Int. Prop. O. . |

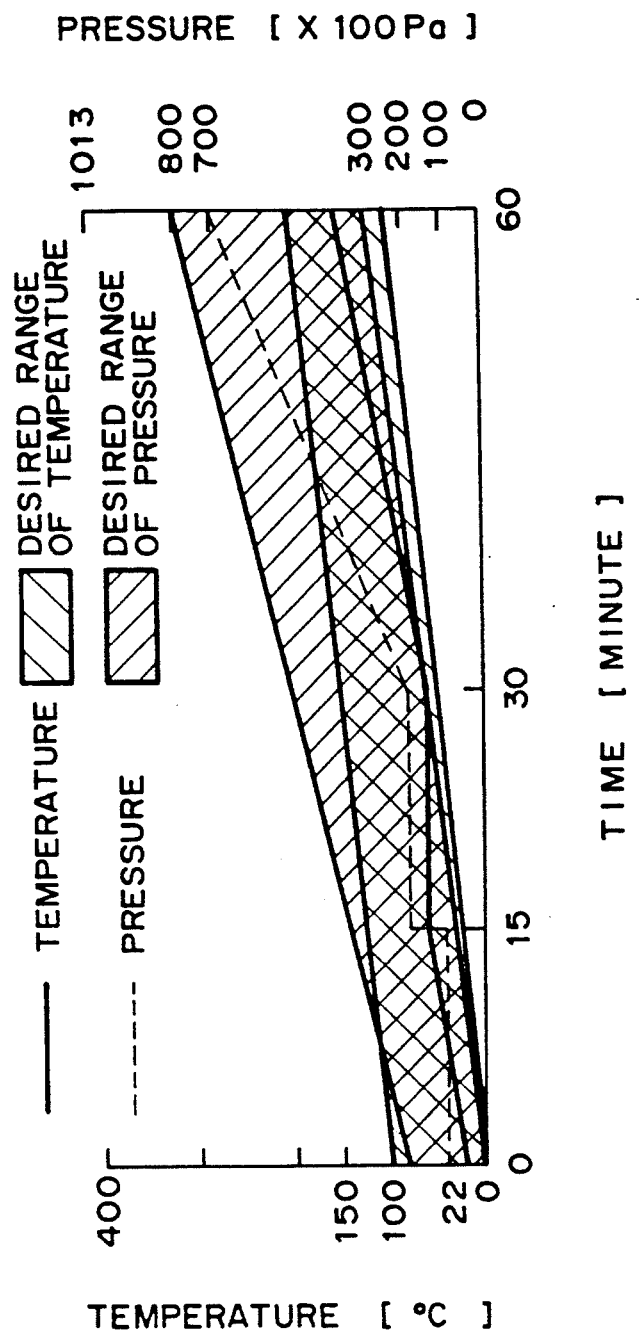

20μm

20μm

ELECTRICAL CONNECTING MEMBER AND METHOD OF MANUFACTURING THE SAME

This application is a continuation of application Ser. No. 07/840,946, filed Feb. 25, 1992 now abandoned.

BACKGROUND OF THE INVENTION

1. Field of the Invention

This invention relates to an electrical connecting member for use when electric circuit parts are to be electrically connected together and a method of manufacturing the same.

2. Related Background Art

As methods of electrically connecting electric circuit parts together, there are known the wire bonding method and the TAB (tape automated bonding) method. However, these methods have suffered from the difficulties that they cannot cope with an increase in the number of connection points between electric circuit parts and that they are costly. In order to overcome such difficulties, it is known to electrically connect electric circuit parts together by the use of an electrical connecting member of a construction having a plurality of electrically conductive members provided in a mutually insulated state in an insulative holding member (Japanese Laid-Open Patent Application No. 63-222437, Japanese Laid-Open Patent Application No. 63-224235, etc.).

FIG. 1 of the accompanying drawings is a schematic view showing the electrical connection of electric circuit parts using such an electrical connecting member. In FIG. 1, the reference numeral 31 designates an electrical connecting member, and the reference numerals 32 and 33 denote electric circuit parts to be connected together. The electrical connecting member 31 comprises a plurality of electrically conductive members 34 formed of a metal or an alloy, electrically insulated from one another and provided in a holding member 35 formed of an electrically insulative material, and one end 38 of each electrically conductive member 34 is exposed on the side of one electric circuit part 32 and the other end 39 of each electrically conductive member 34 is exposed on the side of the other electric circuit part 33 (FIG. 1(a)). The connecting portion 36 of said one electric circuit part 32 and one end 38 of each electrically conductive member 34 exposed on the side of the electric circuit part 32 are made into an alloy to thereby join the two together, and the connecting portion 37 of said other electric circuit part 33 and the other end 39 of each electrically conductive member 34 exposed on the side of the electric circuit part 33 are made into an alloy to thereby join the two together and thus, the electric circuit parts 32 and 33 are electrically connected together (FIG. 1B).

Such an electrical connecting member has the following advantages:

(1) By making the size of the electrically conductive members minute, the connecting portions of electric circuit parts can be made small and therefore, the number of connection points can be increased and consequently, denser connection of the electric circuit parts is possible.

(2) Even in the case of electric circuit parts differing in thickness from each other, it becomes possible to make the height of the electric circuit parts always constant by changing the thickness of the electrical connecting member and thus, multilayer connection can be easily accomplished and denser mounting is possible.

(3) By making the height of protrusion of electrically conductive members connected to the connecting portions of electric circuit parts great, it becomes possible to accomplish stable connection even if the connecting portions of the electric circuit parts are depressed from the surface thereof, and it is possible to easily connect even electric circuit parts of complicated shape together.

A method of manufacturing the above-described electrical connecting member for effecting the electric multipoint connection of electric circuit parts is proposed in Japanese Laid-Open Patent Application No. 2-49385. This method will hereinafter be briefly described with reference to FIG. 2 of the accompanying drawings which schematically shows the steps thereof.

A base body 51 comprising a metal sheet such a copper plate is first prepared, and negative-type photosensitive resin 52 is applied onto this base body 51 by a spin coater, and pre-baking is effected at a temperature of about 100° C. (FIG. 2A). Light is applied to the photosensitive resin 52 through a photomask (not shown) forming a predetermined pattern, whereafter developing liquid is injected to the photosensitive resin or the photosensitive resin is immersed in developing liquid to thereby effect development. The photosensitive resin 52 remains on the portions exposed to light and the photosensitive resin 52 is removed from the portions not exposed to light by the developing process, whereby a plurality of apertures 53 are formed (FIG. 2B). Temperature is increased to 200°-400° C. to cure the photosensitive resin 52, whereafter etching is effected with the base body 51 immersed in etching liquid, whereby recesses 54 communicating with the apertures 53 are formed in the base body 51 (FIG. 2C). Gold plating is then applied with the base body 51 as a common electrode to thereby fill the apertures 53 and recesses 54 with gold 55, and gold plating is continued until bumps are formed (FIG. 2D). Finally the base body 51 is removed by etching, whereby there is manufacture an electrical connecting member 31 (FIG. 2E).

FIG. 3 of the accompanying drawings is a schematic view showing the state of the electroplating step in such a process. In FIG. 3, the reference numeral 61 designates a plating vessel. A mesh-like anode 62 is disposed in the lower portion of the plating vessel 61, and a cathode 63 is disposed in the upper portion of the plating vessel in opposed relationship with the anode 62. An intermediate member 64 as shown in FIG. 2C is placed on the cathode 63, and plating liquid 65 low in gold concentration is caused to flow at a low speed from below toward above to thereby apply so-called strike plating and coat the surfaces of the recesses 54 with gold, whereafter so-called thickening plating is applied by the use of plating liquid high in gold concentration to thereby fill the recesses 54 and apertures 53 with gold, thus forming electrically conductive members 34.

In the electrical connecting member 31 manufactured in this manner, the gold 55 constitutes the electrically conductive members 34 and the photosensitive resin 52 constitutes the holding member 35. As regards the dimensions of respective portions of the electrical connecting member 31, the thickness of the photosensitive resin 52 (the holding member 35) is about 10 μm, the diameter and pitch of the apertures 53 (the electrically conductive members 34) are about 20 μm and about 40 μm, respectively, and the amounts of protrusion of the electrically conductive members 34 on the obverse and reverse are of the order of several μm.

The reliability of the above-described electrical connecting member is achieved by bumps of a uniform shape and uniform height of protrusion being provided.

However, the conventional developing step and the subsequent gold electroplating step have suffered from the following problems.

First, in the developing step, due to the developing liquid infiltrated in the photosensitive resin 52, the photosensitive resin 52 becomes liable to flow with the developing liquid or dissolve in the process of leaving the photosensitive resin 52 as it is after the developing step or in the process of curing the photosensitive resin 52 after the developing step. Accordingly, as shown in FIG. 4 of the accompanying drawings which shows the state before the formation of the recesses 54 on an enlarged scale, the formed apertures 53 are tapered at 53a or the pattern thereof gets out of shape, and the shape of the apertures 53 becomes irregular. This leads to the problem that in the manufactured electrical connecting member 31, the shape of the electrically conductive members is not stable.

There is further a problem of resin-like residue. As shown in FIG. 2B, the photosensitive resin 52 is exposed to light and developed to thereby form at the bottom the apertures 53 through which the surface of the metal sheet 51 is exposed, but as shown in FIG. 5 of the accompanying drawings, undeveloped portions 56 may remain at the bottom of the apertures 53 in the photosensitive resin 52 and resin-like residue may remain in some cases. The presence of the undeveloped portions 56 is considered to be attributable to a case where the stagnancy of the developing liquid occurs and the development at the bottom becomes insufficient, or a case where the force of intimate contact between the photosensitive resin 52 and the metal sheet 51 is great and therefore it is difficult for development to take place, or a case where these two cases are compounded.

On the other hand, the occurrence of the resin-like residue becomes remarkable when the aspect ratio (film thickness/diameter of opening) of the apertures 53 is great, or when the exposure and developing conditions are inappropriate, or when diffracted light and/or reflected light irradiates the portions of the photosensitive resin which should not be exposed to the light. The presence of such resin-like residue has led to the problem that it hampers the exposure of the surface of the metal sheet 51 at the bottom of the apertures 53 and as shown in FIG. 5B, the shape of the recesses 54 is made irregular in the process of etching the surface of the metal sheet 51 and as shown in FIG. 5C, the shape of bumps is not constant and the electrical characteristic is not stable.

Also, in the gold plating step, there is the problem that the shape (e.g. diameter and amount of protrusion) of the gold bumps becomes non-uniform depending on the gold electroplating conditions, for example, the Reynolds number of liquid flow imparted to the plating liquid, the current density, the amount of a plating liquid additive etc.

Taking the current density distribution as an example, the amount of plating deposition is greater in the central portion than in the marginal portion under the influence of the current density distribution and therefore, in an electrical connecting member, the amount of protrusion of electrically conductive members present in the central portion becomes greater than the amount of protrusion of electrically conductive members present in the marginal portion and thus, it is not easy to make the diameter of protrusion and the height of protrusion of the electrically conductive members uniform. FIG. 6 of the accompanying drawings is a plan view of an electrical connecting member having four electrically conductive members 34, and FIG. 7 of the accompanying drawings is a plan view of an electrical connecting member having seven electrically conductive members 34. In the example shown in FIG. 6 wherein four electrically conductive members 34 are located at the verteces of a lozenge, the amount of protrusion of the two electrically conductive members 34 at the vertices the diagonal of which is shorter is greater than that of the other two electrically conductive members 34. Also, in the example shown in FIG. 7 wherein six electrically conductive members 34 are disposed so as to surround an electrically conductive member 34, the central one is greater in the amount of protrusion than the other six ones. Further, FIG. 8 of the accompanying drawings is a fragmentary plan view of an electrical connecting member 31 forming a pattern in which a number of rows of seven electrically conductive members 34 each are disposed. In each row, the amount of protrusion is smaller in the marginal portion than in the central portion. This is considered to be because the combined effect of the density of electric current is higher in the central portion than in the marginal portion. This leads to the problem that the bump deformation during the pressure joining of the electrical connecting member becomes great in a case where the amount of protrusion is great and this causes short-circuiting.

Also, it is necessary to make the shape of the formed gold protrusions constant so that bad connection may not occur in the above-described TAB, and various methods of forming gold protrusions of stable shape by gold plating have heretofore been proposed. These methods include, for example, a method of removing the ground metal layer just beneath the gold protrusions (Japanese Laid-Open Patent Application No. 61-141157), a method of leaving resist at the center of the opening portion (Japanese Laid-Open Patent Application No. 62-252951), a method of repeating the photolithography step and the gold plating step (Japanese Laid-Open Patent Application No. 63-175446), etc.

However, the forming methods as described above suffer from such problems as will be described below. In the method of removing the ground metal layer just beneath the gold protrusions, the removing step is cumbersome, and when the ground metal layer is removed in its liquid phase, etching liquid remains and this remaining liquid is liable to be mixed with the gold plating liquid to cause a bad shape. Also, in the method of leaving resist at the center of the opening portion, the area of contact with the ground metal layer is small and therefore the intimate contact property is deficient and thus, this method is liable to cause a reduction in the strength of the protrusions during boding. Further, the method of repeating the photolithography step and the gold plating method generally requires a long time as the steps, and the alignment in the photolithography step is difficult, and this leads to the problem that the control of the height of the gold plating in each step is difficult.

SUMMARY OF THE INVENTION

It is an object of the present invention to provide an electrical connecting member capable of electrically connecting electric circuit parts together well and a method of manufacturing the same.

It is another object of the present invention to provide an electrical connecting member manufactured by the developing step and the gold electroplating step for providing gold bumps of uniform shape and a method of manufacturing the same.

It is still another object of the present invention to provide an electrical connecting member in which the remaining of undeveloped portions in apertures is prevented and resin-like residue is effectively removed to thereby make uniform the shape of recesses to be formed in a base body and eliminate the irregularity of the shape of bumps, thus achieving the stabilization of characteristic and an improvement in yield, and a method of manufacturing the same.

It is yet still another object of the present invention to provide an electrical connecting member in which an intermediate member after the developing step is left in a heated atmosphere and/or a negative pressure atmosphere for a predetermined time and thereafter is heated and cured to thereby solve the problems as noted above and a number of apertures of a predetermined shape can be formed in photosensitive resin and the shape of all electrically conductive members is uniform, and a method of manufacturing the same.

It is a further object of the present invention to provide a method of forming gold protrusions, which method can limit the gold electroplating conditions to thereby easily form gold protrusions having a stable shape.

It is still a further object of the present invention to provide an electrical connecting member which is made to have a uniform amount of protrusion by adjusting the temperature of plating liquid, the flow velocity of the plating liquid and the density of electric current in the plating step for the formation of bumps and which is capable of high density joining, and a method of manufacturing the same.

BRIEF DESCRIPTION OF THE DRAWINGS

FIG. 20 is a graph showing still another example of the mode of a heated atmosphere and/or a negative pressure atmosphere in the manufacturing method according to the embodiment of the present invention.

DESCRIPTION OF THE PREFERRED EMBODIMENT

The present invention will hereinafter be specifically described with reference to the drawings which show an embodiment thereof.

Figure 9A:
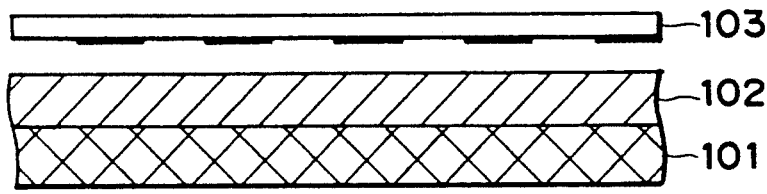
FIGS. 9A-9E are schematic cross-sectional views showing the essential steps of a manufacturing method according to an embodiment of the present invention.
Figure 9B:
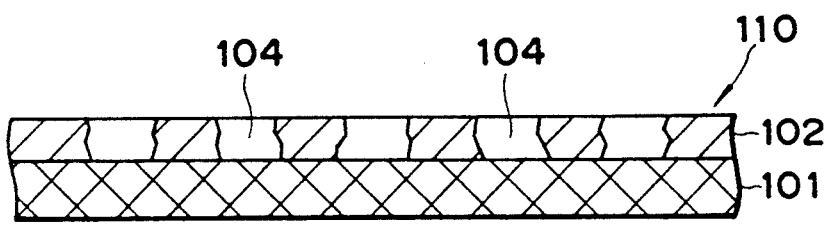

FIGS. 9A-9B are schematic cross-sectional views showing the manufacturing steps according to an embodiment of the present invention. Negative type polyimide resin 102 which is photosensitive resin is first applied onto a copper plate 101 which is a base body by a spin coater, and then is pre-baked, whereafter light (not shown) is applied to the polyimide resin 102 through a photomask 103 forming a predetermined pattern (FIG. 9A). The film thickness of the applied polyimide resin 102 is made greater than the desired film thickness of a holding member in an electrical connecting member to be manufactured, with a decrease by the curing and shrinkage of the resin taken into account.

Subsequently, developing liquid is injected to the polyimide resin or the polyimide resin is immersed in developing liquid to thereby effect development.

Figure 10:
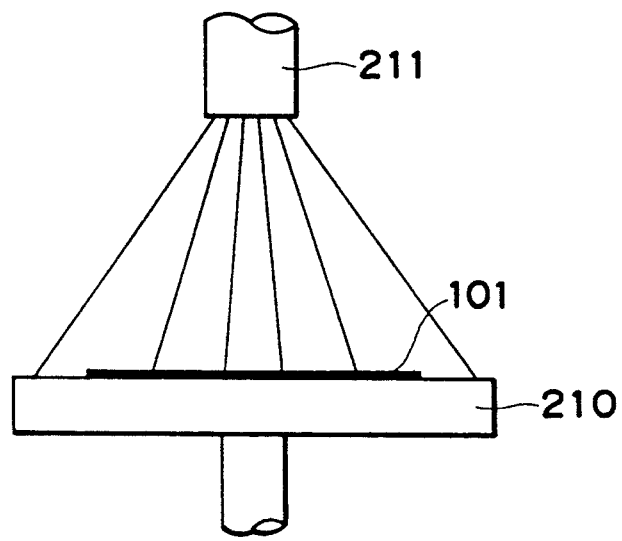
FIG. 10 is a schematic view showing a developing mode in the embodiment of the present invention.

FIG. 10 is a schematic view showing a developing mode in the present embodiment. The copper plate 101 which is the base body (together with the photo-sensitive resin 102 exposed to light) is placed on a turn table 210, and developing liquid is intermittently injected to the surface of the copper plate 101 from an injection nozzle 211 for the developing liquid disposed above and in opposed relationship with the turn table 210 while the turn table 210 is continuously rotated at a predetermined speed, whereby development is effected.

Figure 11A:
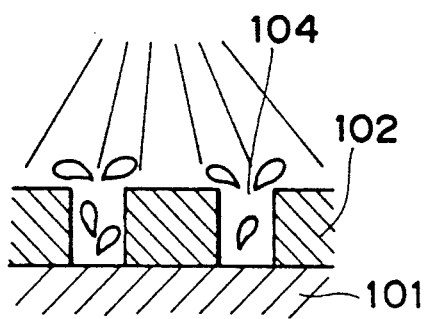
FIGS. 11A and 11B are fragmentary enlarged cross-sectional views showing the states during the injection of developing liquid and during the stoppage of the injection of the developing liquid, respectively.
Figure 11B:
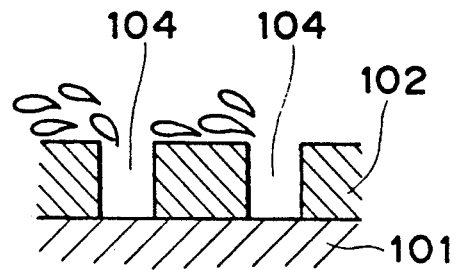

FIG. 11A is a fragmentary enlarged view showing the state during the injection of the developing liquid, and FIG. 11B is a fragmentary enlarged view showing the state during the stoppage of the injection of the developing liquid. In the injection process of the developing liquid, the developing liquid collects and stagnates in apertures 104 formed by development, but in the injection stopping process of the developing liquid, the developing liquid is discharged out of the apertures 104 with residue by a centrifugal force and development is expedited by the injection of fresh developing liquid.

Figure 12:
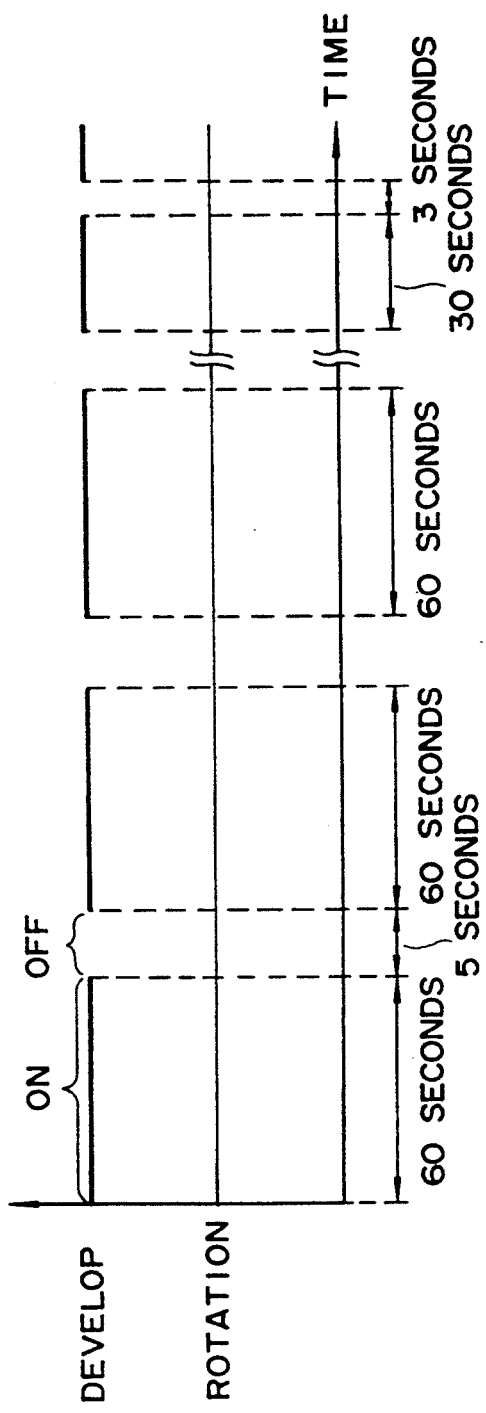
FIG. 12 is a time chart showing the patterns during the injection of the developing liquid and during the stoppage of the injection of the developing liquid, respectively.

Referring to FIG. 12 which is a time chart showing the injection timing of the developing liquid, the horizontal axis represents time and the vertical axis represents the injection state and injection stopped state of the developing liquid. As is apparent from this time chart, about 60-second's continuous injection of the developing liquid and 5-second's stoppage of injection are repeated and besides, 30-second's injection and 3-second's stoppage of injection are repeated, and in this manner, the injection time and the injection stoppage time are set as required to thereby effect the injection and the stoppage alternately.

Figure 13:
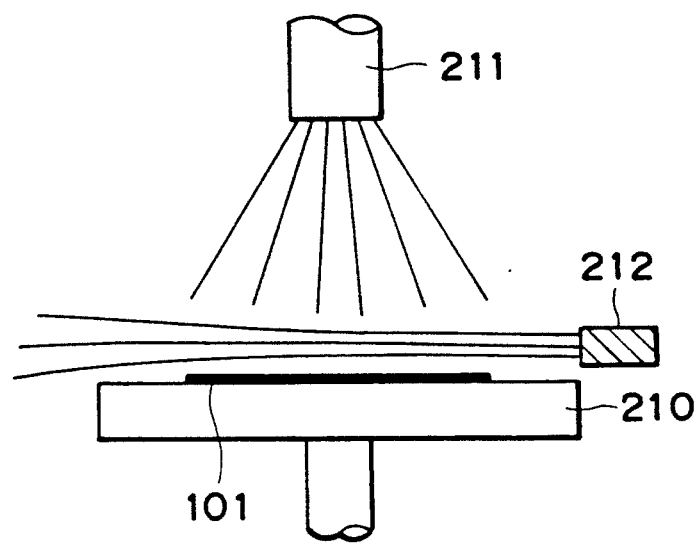
FIG. 13 is a schematic view showing another developing mode used in the embodiment of the present invention.
Figure 14:
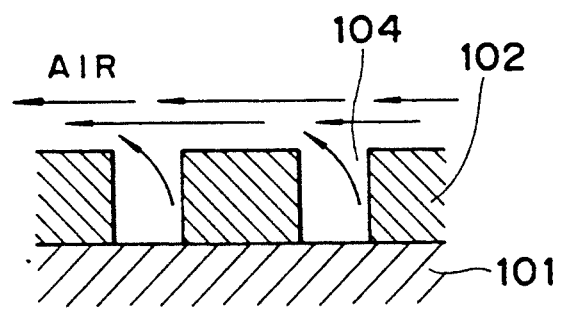
FIG. 14 is a fragmentary enlarged cross-sectional view of the surface of a copper plate 1 shown in FIG. 13.

FIG. 13 is a schematic view showing another developing mode used in the present embodiment, and FIG. 14 is a fragmentary enlarged cross-sectional view of the surface of the copper plate 101. The upper plate 101 is placed on the turn table 210 rotated at a predetermined speed, and the developing liquid is continuously injected from the injection nozzle 211 disposed above and in opposed relationship with the turn table, and an air nozzle 212 is disposed sideways of the turn table 210 in proximity to and in parallelism to the surface of the turn table 210, and air is injected along the surface of the copper plate 101 from the air nozzle 212 with pressure of the order of 0–10 kgf/cm².

Thus, as shown in FIG. 14, negative pressure is created in the apertures 104 by the sucking action of air and the developing liquid and developing residue in the apertures 104 are sucked and removed. The developing liquid is continuously or intermittently injected from the injection nozzle 211.

Figure 15:
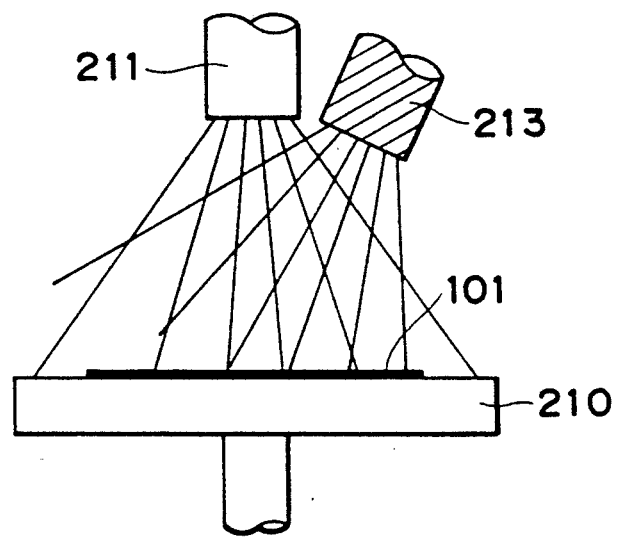
FIG. 15 is a schematic view showing still another developing mode used in the embodiment of the present invention.

FIG. 15 is a schematic view showing still another developing mode used in the present embodiment. An air nozzle 213 is somewhat obliquely disposed sideways of the injection nozzle 211 for the developing liquid.

Thus, air is directly blown toward the interior of the apertures 104 and the removal of the developing liquid and residue in the deep apertures 104 from which the suction is difficult can be accomplished more effectively. The developing liquid is continuously or intermittently injected from the injection nozzle 211 for the developing liquid.

Figure 16:
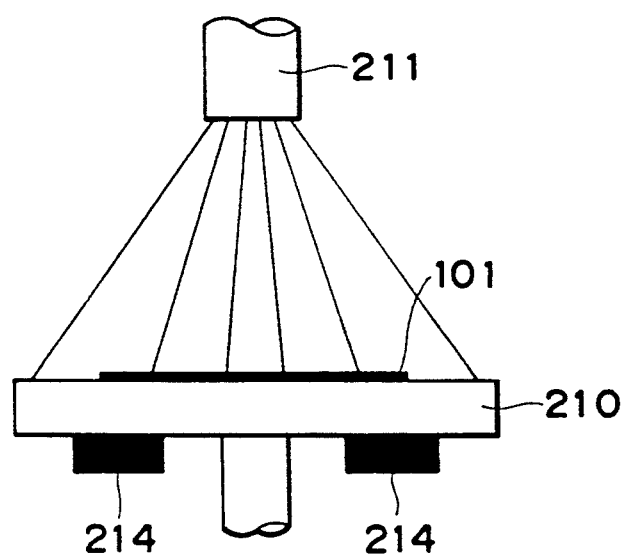
FIG. 16 is a schematic view showing yet still another developing mode used in the embodiment of the present invention.

FIG. 16 is a schematic view showing yet still another developing mode used in the present embodiment. Ultrasonic vibrators 214 of e.g. 20 kHz to 10 MHz as a single or plural kinds of frequencies are attached to the underside of the turn table 210. In such a developing method, the turn table 210 and the copper plate 101 are vibrated at a high speed, whereby the circulation of the developing liquid in the apertures is expedited and the removal of residue can be accomplished effectively. The developing liquid is continuously or intermittently injected from the injection nozzle 211 for the developing liquid.

Figure 17:
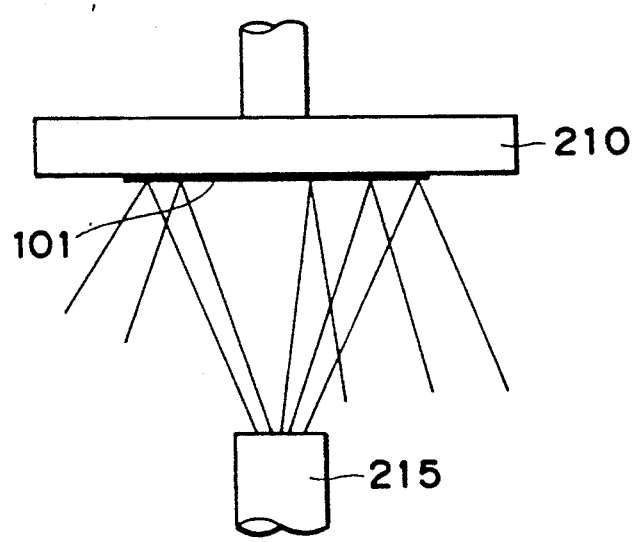
FIG. 17 is a schematic view showing a further developing mode used in the embodiment of the present invention.

FIG. 17 is a schematic view showing a further developing mode used in the present embodiment. The turn table 210 is provided so as to face downwardly and the copper plate 101 is fixed to the underside thereof by a fixture, not shown, and an injection nozzle 215 for developing liquid is disposed below and in opposed relationship with the turn table 210.

By such a construction, the developing liquid injected into the apertures 104 does not collect in the apertures 104 but can be automatically discharged with residue, and the circulation efficiency of the developing liquid in the apertures 104 is improved. The developing liquid is continuously or intermittently injected from the injection nozzle 215.

While in the above-described embodiments, the developing modes shown in FIGS. 10, 13, 15, 16 and 17 have been described as being individually applied, a suitable combination of two or three or more of these modes may of course be effected.

The polyimide resin 102 remains in the portions exposed to light and the polyimide resin 102 is removed from the portions not exposed to light by the developing process, whereby a plurality of apertures 104 are formed in the polyimide resin 102 (FIG. 9B). At this time, the developing liquid infiltrates into the polyimide resin 102, which is thus expanded a little, and the diameter of the apertures 104 formed in the polyimide resin 102 becomes smaller than the predetermined pattern of the photomask 103 and the shape of the formed apertures 104 is not constant.

Figure 9C:
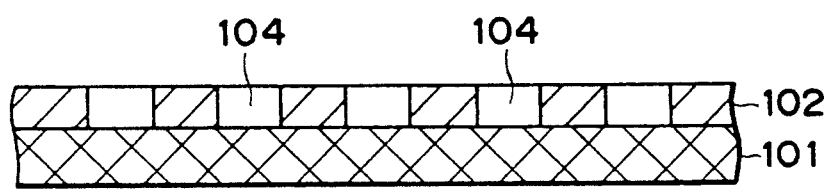
Figure 18:
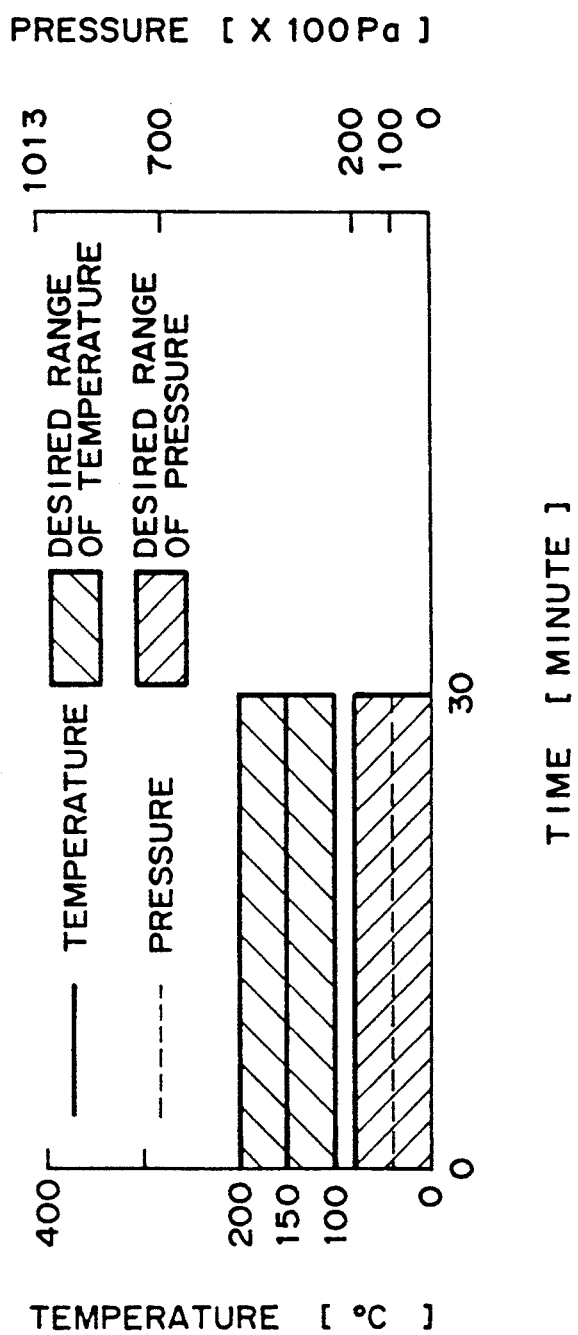
FIG. 18 is a graph showing an example of the mode of a heated atmosphere and/or a negative pressure atmosphere in the manufacturing method according to the embodiment of the present invention.

Then, before the collapse or shape change of the pattern occurs, the intermediate member 110 after the developing step is left in one or both of heated and negative pressure atmospheres for a predetermined time to thereby evaporate the developing liquid which has infiltrated into the polyimide resin 102. FIG. 18 shows an example of the atmosphere in this case (a case where the boiling point of the developing liquid is 200° C.). The termination of the time for which the intermediate member is left in such an atmosphere can be judged at a point of time whereat the weight of the intermediate member 110 scarcely changes after greatly decreased by the evaporation of the developing liquid. Also, in order to expedite the evaporation of the developing liquid, it is better to leave the intermediate member 110 in said atmosphere while the treatment of the exhaust is effected. When the intermediate member is left in such an atmosphere, the developing liquid which has infiltrated into the polyimide resin 102 is removed to thereby form a plurality of apertures 104 having a uniform pattern shape having no taper formed (FIG. 9C).

Figure 9D:
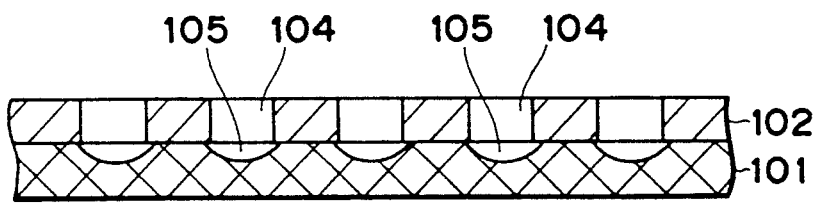
Figure 9E:
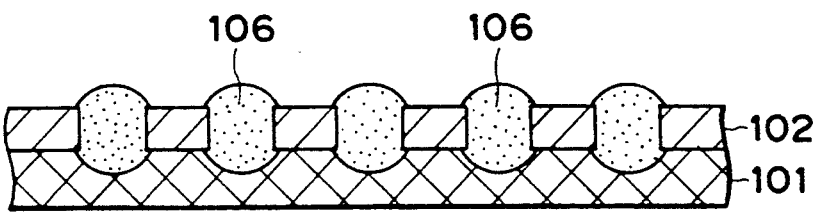

Subsequently, the heating temperature is increased to 200°-400° C. to thereby cure the polyimide resin 102, whereafter the copper plate 101 is immersed in etching liquid to thereby effect the etching of the copper plate 101 and remove the portions of the copper plate 101 which are near the apertures 104 by etching, thereby forming in the copper plate 101 recesses 105 communicating with the apertures 104 (FIG. 9D). It is to be understood that the diameter of the recesses 105 formed at this time is larger than the diameter of the apertures 104 and small than a half of the distance to the outer periphery of the adjacent aperture 104. By the size of the recesses 105 being thus controlled, there can be manufactured an electrical connecting member in which adjacent electrically conductive members do not conduct and moreover the electrically conductive members do not slip out.

Figure 19:
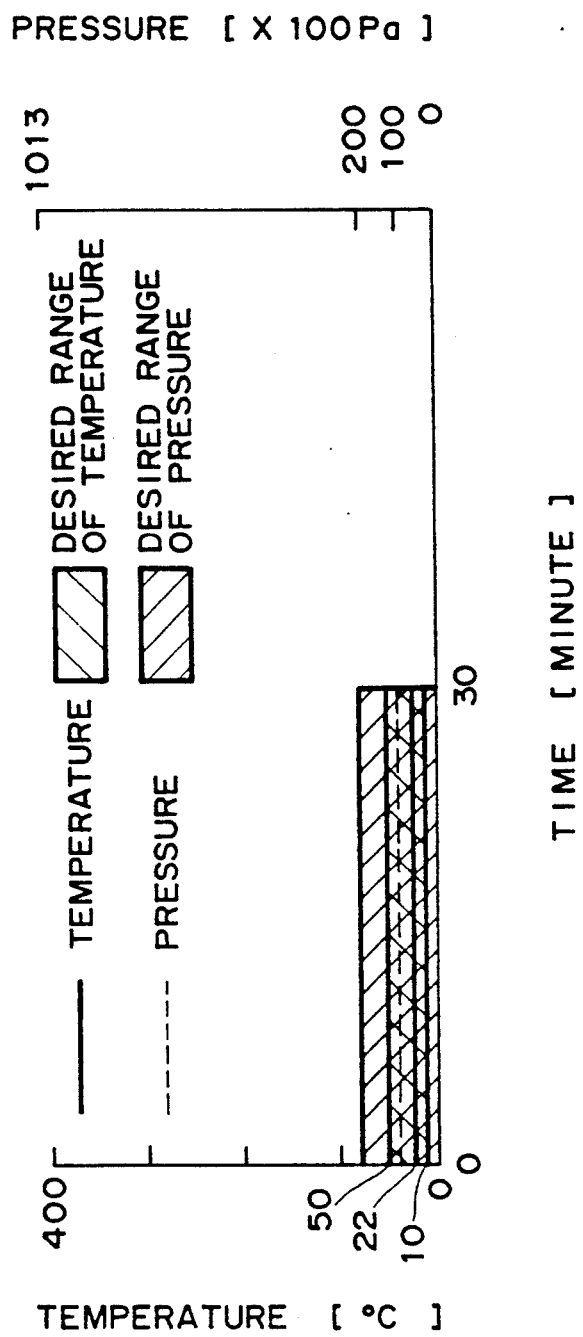
FIG. 19 is a graph showing another example of the mode of a heated atmosphere and/or a negative pressure atmosphere in the manufacturing method according to the embodiment of the present invention.

In the above-described embodiment, when removing the developing liquid which has infiltrated into the polyimide resin 102, the intermediate member 110 is left in the heated and negative pressure atmospheres, but alternatively, the intermediate member may be left in one of the heated atmosphere and the negative pressure atmosphere. Examples of the atmosphere in such a case (a case where the boiling point of the developing liquid is 200° C.) are shown in FIGS. 19 and 20. FIG. 19 represents an example of the normal temperature and negative pressure atmosphere, and FIG. 20 represents an example of the heated and increased pressure atmosphere. In any case, as in the aforedescribed embodiment, there can be formed a plurality of apertures 104 forming a uniform pattern.

Description will now be made of the plating step according to the embodiment of the present invention. Gold is grown in openings formed by photoresist of a predetermined pattern, by electroplating, to thereby form gold protrusions. In order to make the reproducibility of a plating experiment, a rotatable disk electrode (R.D.E.) is used as an electrode. The Reynolds number ($N_{Re}$) of the liquid flow in this case is represented by the following equation (1):

$$N_{Re} = \Omega \gamma^2 / \eta, \qquad (1)$$

where $\Omega$ is the number of rotations, $\gamma$ is the rotation radius, and $\eta$ is the coefficient of kinematic viscosity.

In order to uniformize the flow condition, gold protrusions are formed at locations of 8 mm from the center of the rotational shaft, and gold plating liquid of sulfite line is used as gold plating liquid.

Figure 21A:
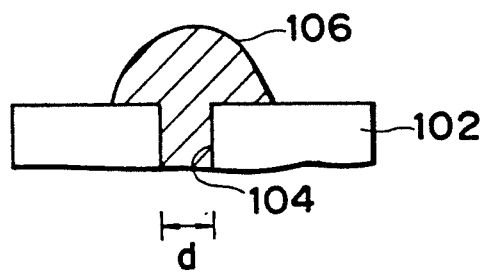
FIGS. 21A-21C are schematic cross-sectional views showing the shape of a gold protrusion formed.
Figure 21B:
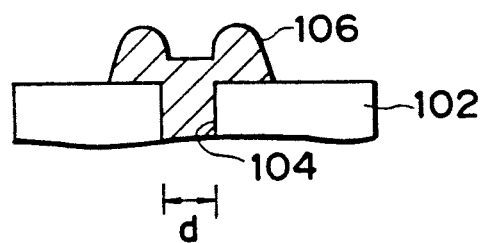
Figure 21C:
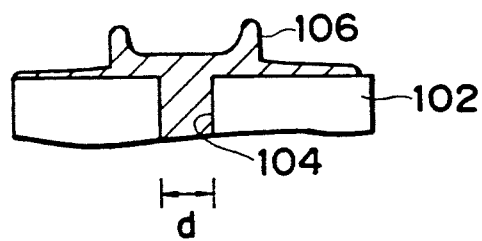

The shape of gold protrusions thus formed is observed by means of a scanning type electronic microscope. FIGS. 21A-21C are cross-sectional views showing the shape of a gold protrusion formed. In FIG. 21, the reference numeral 102 designates photoresist which provides a holding member, and an opening 104 to be gold-lated is provided by the photoresist 102 of a predetermined pattern, and a gold protrusion 106 is formed in the opening 104. d indicates the diameter of the opening 104.

The shape of the formed gold protrusion can be classified into three kinds as shown in FIG. 21. FIG. 21A shows an ideal shape forming an upwardly convex shape, and such a shape will hereinafter be referred to as A. FIG. 21B shows a bad shape having a depression formed in the central portion of the protrusion, and such a shape will hereinafter be referred to as B. FIG. 21C shows a bad shape having a lateral expanse formed toward the marginal portion of the protrusion, and such a shape will hereinafter be referred to as C.

Description will now be specifically made of an experimental example in which gold protrusions 106 were formed with the gold electroplating conditions changed.

Reynolds Number, Diameter of the Openings, Current Density and the Shape of Gold Protrusions The photoresist 102 was patternized so that the diameter d of the openings 104 might be 10 μm, 15 μm, 30 μm, 50 μm, 80 μm and 100 μm, and gold protrusions 106 were formed relative to the openings 104 with the Reynolds number ($N_{Re}$) of the plating liquid as 0, 10, 30, 50, 100 and 200. 30 ppm of Tl was added to the plating liquid, and a quantity of electricity of 25 C/cm² was imparted with the current density as 4 mA/cm². The formed gold protrusions 106 were observed by means of a scanning type electronic microscope. The result of this observation is shown in Table 1 below.

TABLE 1

| | Reynolds Number ($N_{Re}$) | | | | | | |
|---|---|---|---|---|---|---|---|
| | 0 | 10 | 30 | 50 | 100 | 200 | 450 |
| Diameter d (μm) of Openings 10 | | | | | | | |
| 200 | C | C | B | B | B | B | B |
| 150 | C | C | B | A | A | A | A |
| 100 | C | C | B | A | A | A | A |
| 80 | C | C | B | A | A | A | A |
| 50 | C | C | B | A | A | A | A |
| 30 | C | C | B | A | A | A | A |
| 15 | C | B | A | A | A | A | A |
| 10 | C | B | A | A | A | A | A |

When Reynolds number ($N_{Re}$) is 30, a bad shape is formed if the diameter d of the openings 104 is 30 μm or greater. On the other hand, when $N_{Re}$ is a laminar flow of 50 to 450, there is provided a shape which is ideal in every point.

In Table 1, the current density is constant at 4 mA/cm², but next, an experiment similar to Table 1 was carried out with the current density varied to 1 mA/cm², 2 mA/cm², 3 mA/cm², 4 mA/cm², 5 mA/cm², 6 and 8 mA/cm². The result of the observation in this case is shown in Table 2 below.

TABLE 2

| Current Density (mA/cm²) | | | | | | |
|---|---|---|---|---|---|---|
| 1 | 2 | 3 | 4 | 5 | 6 | 8 |
| A | A | A | A | A | B | C |

When the current density is 6 mA/cm² or greater, the shape of type A becomes null in all ranges of the Reynolds number 0 to 450 and the diameter of the openings of 10 μm to 200 μm in Table 1, and the bad shapes of types B and C are created. Accordingly, from Tables 1 and 2, it is seen that it is preferable that the diameter d of the openings be equal to or greater than 10 μm and equal to or less than 150 μm, the Reynolds number $N_{Re}$ of the plating liquid be a laminar flow equal to or greater than 50 and equal to or less than 450 and the current density be equal to or greater than 1 mA/cm² and equal to or less than 5 mA/cm².

Additive and Shape of gold Protrusions

Under the conditions for obtaining the good shape of the gold protrusions from the results shown in Tables 1 and 2 above, i.e., the conditions that the diameter d of the openings is equal to or greater than 10 μm and equal to or less than 150 μm, the Reynolds number $N_{Re}$ of the plating liquid is a laminar flow equal to or greater than 50 and equal to or less than 450 and the current density is equal to or greater than 1 mA/cm$^2$ and equal to or less than 5 mA/cm$^2$, experiments were further carried out about the influence of an additive added to the plating liquid.

Under the aforedescribed conditions for obtaining the good shape of the gold protrusions, the quantity of Tl added to the plating liquid was varied to 0 ppm, 10 ppm, 30 ppm, 60 ppm, 90 ppm, 100 ppm, 500 ppm and 1,000 ppm to thereby form gold protrusions. The result is shown in table 3 below.

TABLE 3

| Quantity of Tl added (ppm) | | | | | | | |
|---|---|---|---|---|---|---|---|
| 0 | 10 | 30 | 60 | 90 | 100 | 500 | 1,000 |
| C | C | A | A | A | A | B | B |

From Table 3 above, it is seen that when the diameter d of the openings is equal to or greater than 10 μm and equal to or less than 150 μm and the Reynolds number $N_{Re}$ of the plating liquid is a laminar flow equal to or greater than 50 and equal to or less than 450 and the current density is equal to or greater than 1 mA/cm$^2$ and equal to or less than 5 mA/cm$^2$, the good shape of the gold protrusions is obtained if 30 ppm to 100 ppm of Tl is added to the plating liquid.

Further, similar experiments were carried out with As used as an additive instead of Tl. The result is shown in Table 4 below.

TABLE 4

| Quantity of As added (ppm) | | | | | | | |
|---|---|---|---|---|---|---|---|
| 0 | 10 | 30 | 60 | 90 | 100 | 500 | 1,000 |
| C | B | A | A | A | A | A | B |

From Table 4 above, it is seen that when the diameter d of the openings is equal to or greater than 10 μm and equal to or less than 150 μm and the Reynolds number $N_{Re}$ of the plating liquid is a laminar flow equal to or greater than 50 and equal to or less than 450 and the current density is equal to or grater than 1 mA/cm$^2$ and equal to or less than 5 mA/cm$^2$, the good shape of the gold protrusions is obtained if 30 ppm to 100 ppm of Tl is added to the plating liquid.

Description will now be made of another mode of the plating step which can realize gold protrusions 106 of a good shape, particularly the with a uniform amount of protrusion. In the plating step, the temperature of the plating liquid is kept at room temperature (0°–40° C.) and the flow velocity of the plating liquid and the current density are varied in conformity with the growth of plating. Not all of these conditions need be satisfied, but depending on the number and arrangement pattern of electrically conductive members in an electrical connecting member to be manufactured, the uniformity of the amount of protrusion of that electrically conductive members can be realized by a single condition or a combination of any conditions.

Description will now be made of examples in which electrical connecting members provided with electrically conductive members forming various arrangement patterns were manufactured by the use of the manufacturing method of the present embodiment and the prior-art manufacturing method.

(1) Case where the electrically conductive members form a pattern of five or more rows Manufacturing conditions: the same conditions for both of the present embodiment and the prior-art example The diameter of 105: 22 μm,
the depth of recesses 105: 5 μm,
the diameter of apertures 104: 15 μm,
the depth of apertures 104 (the thickness of polyimide resin 102): 9 μm,
the pitch of adjacent apertures 104: 55 μm

PRIOR-ART EXAMPLE

Plating liquid: Neutronex 210N produced by EEJA
Plating conditions: temperature of plating liquid: 65° C., current density: 0.4 A/dm$^2$, plating time: 90 minutes, flow velocity of plating liquid: 7 m/min. (constant)

Present Embodiment

Plating liquid: Neutronex 210N produced by EEJA
Plating conditions: temperature of plating liquid: 23° C., current density: 0.4 A/dm$^2$, plating time: 90 minutes, flow velocity of plating liquid: 7 m/min. (constant)

Figure 22:
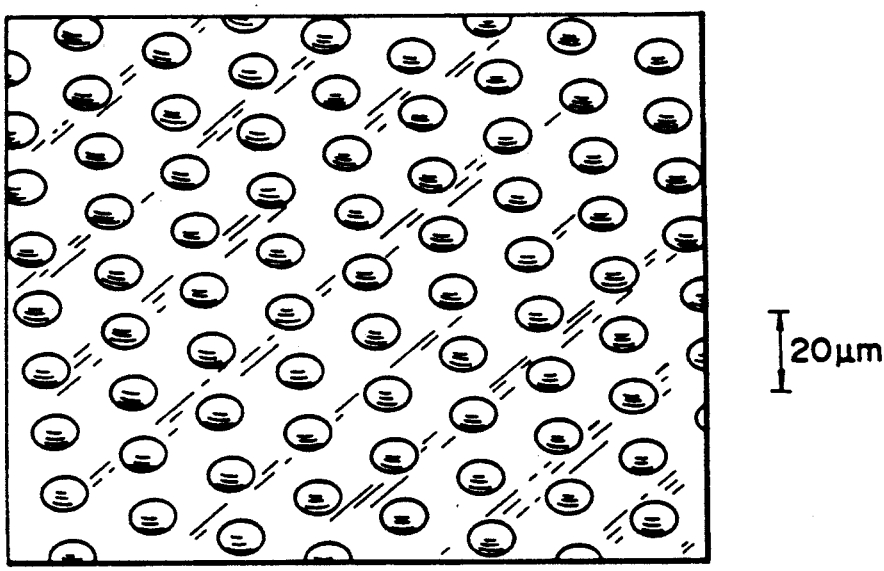
FIG. 22 is a schematic plan view of electrically conductive members in an electrical connecting member manufactured by a prior-art manufacturing method.
Figure 23:
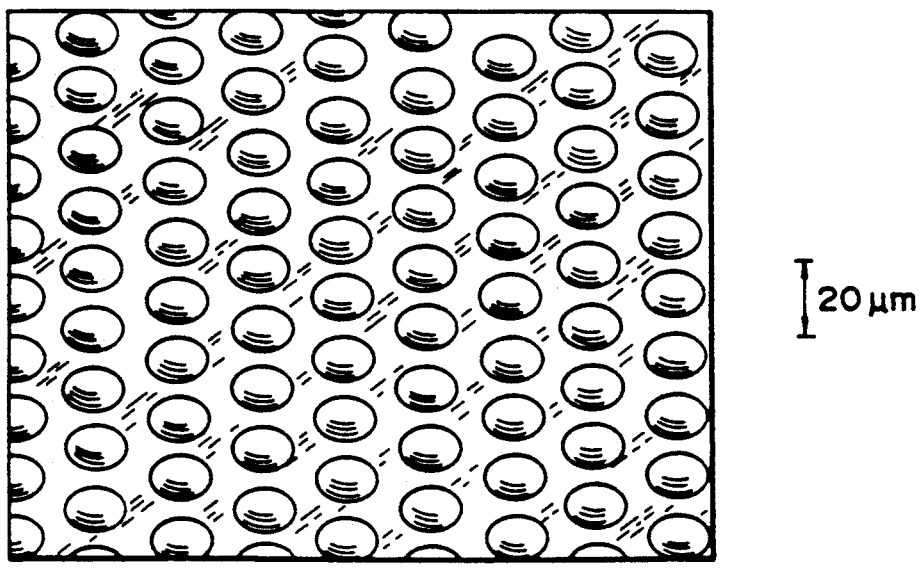
FIG. 23 is a schematic plan view of electrically conductive members in an electrical connecting member manufactured by a manufacturing method according to the embodiment of the present invention.

The plan view shapes of the electrically conductive members in the prior-art example and the present embodiment of case (1) are schematically shown in FIGS. 22 and 23, respectively. In the prior-art example in FIG. 22, the amount of protrusion of the electrically conductive members differs between the central portion and the marginal portion, while in the present embodiment in FIG. 23, electrically conductive members uniform in the amount of protrusion are formed over the whole area. Like this, in a pattern of five or more rows, a uniform amount of plating deposition of gold can be achieved simply by adjusting the temperature of the plating liquid.

(2) Case where the electrically conductive members form a pattern of three or less rows Manufacturing conditions: the same conditions for both of the present embodiment and the prior-art example The diameter of recesses 105: 22 μm,
the depth of recesses 105: 5 μm,
the diameter of apertures 104: 15 μm,
the depth of apertures 104 (the thickness of polyimide resin): 9 μm,
the pitch of adjacent apertures 104: 40 μm

PRIOR-ART EXAMPLE

Plating liquid: Neutronex 210N produced by EEJA
Plating conditions: temperature of plating liquid: 65° C., current density: 0.4 A/dm$^2$, plating time: 90 minutes, flow velocity of plating liquid: 7 m/min. (constant)

Present Embodiment

Plating liquid: Neutronex 210N produced by EEJA
Plating conditions: temperature of plating liquid: 23° C., current density: 0.4 A/dm$^2$, plating time: 90 minutes, flow velocity of plating liquid: 3 m/min. (during the first half 45 minutes), 0.6 m/min. (during the second half 45 minutes)

Figure 24:
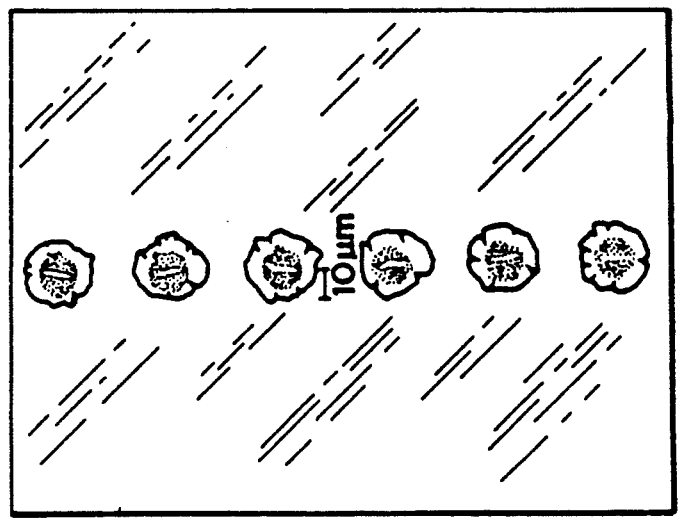
FIG. 24 is a schematic plan view of electrically conductive members in an electrical connecting member manufactured by the prior-art manufacturing method.
Figure 25:
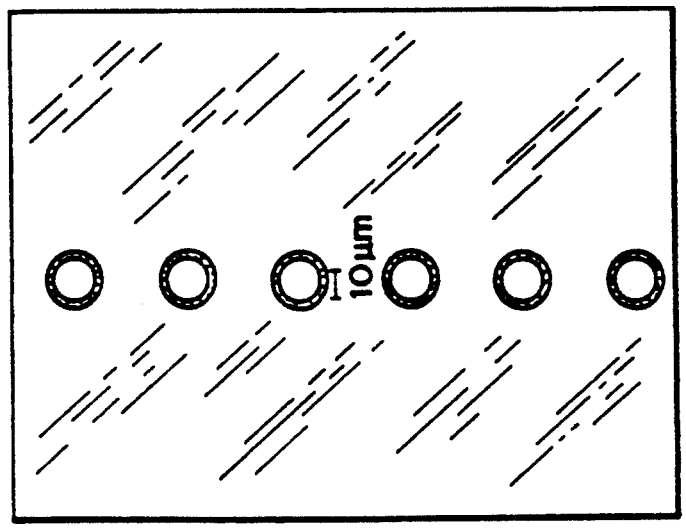
FIG. 25 is a schematic plan view of electrically conductive members in an electrical connecting member manufactured by the manufacturing method according to the embodiment of the present invention.

The plan view shapes of the electrically conductive members in the prior-art example and the present embodiment of case (2) are schematically shown in FIGS. 24 and 25, respectively. In the prior-art example in FIG. 24, few electrically conductive members are formed, while in the present embodiment in FIG. 25, electrically conductive members uniform in the amount of protrusion are formed over the whole area. Like this, in a pattern of three or less rows, a uniform amount of plating deposition of gold can be achieved by adjusting the temperature of the plating liquid and the flow velocity of the plating liquid.

Figure 6:
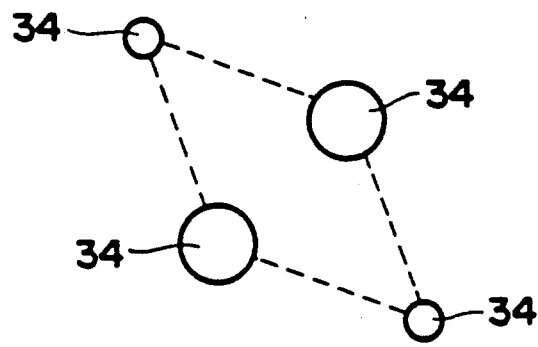
FIG. 6 is a schematic view for illustrating problems in the prior-art manufacturing method.

(3) Case where four electrically conductive members form a lozenge-shaped arrangement pattern (FIG. 6)

Manufacturing conditions: the same conditions for both of the present embodiment and the prior-art example
- The diameter of recesses 105: 22 μm,
  the depth of recesses 105: 5 μm,
  the diameter of apertures 104: 15 μm,
  the depth of apertures 104 (the thickness of polyimide resin 102): 9 μm,
  the pitch of adjacent apertures 104: 40 μm

PRIOR-ART EXAMPLE

Plating liquid: Neutronex 210N produced by EEJA
Plating conditions: temperature of plating liquid: 65° C., current density: 0.4 A/dm², plating time: 90 minutes, flow velocity of plating liquid: 7 m/min. (constant)

Present Embodiment

Plating liquid: Neutronex 210N produced by EEJA (during the first half 45 minutes), Fine Form produced by EEJA (during the second half 60 minutes)
Plating conditions: temperature of plating liquid: 23° C., current density: 0.4 A/dm² (during the first half 45 minutes), 0.6 A/dm² (during the second half 60 minutes), plating time: 105 minutes, flow velocity of plating liquid: 3 m/min. (during the first half 45 minutes), 0 m/min. (during the second half 60 minutes)

Figure 26:
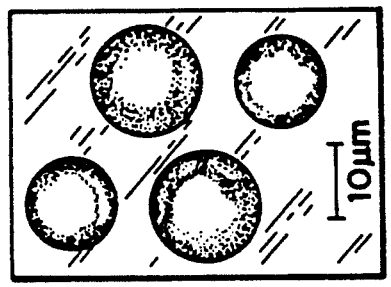
FIG. 26 is a schematic plan view of electrically conductive members in an electrical connecting member manufactured by the prior-art manufacturing method.
Figure 27:
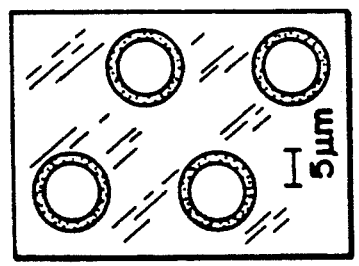
FIG. 27 is a schematic plan view of electrically conductive members in an electrical connecting member manufactured by the manufacturing method according to the embodiment of the present invention.

The plan view shapes of the electrically conductive members in the prior-art example and the present embodiment of case (3) are shown in FIGS. 26 and 27, respectively. In the prior-art example in FIG. 26, two electrically conductive members each differ in the amount of protrusion, while in the present embodiment in FIG. 27, all of four electrically conductive members are uniform in the amount of protrusion. Like this, in a pattern of a few members, a uniform amount of plating deposition of gold can be achieved by adjusting the kind of the plating liquid, the temperature of the plating liquid, the flow velocity of the plating liquid and the current density. Also, in the present embodiment, the temperature of the plating liquid was 23° C., but a similar effect was obtained when the temperature of the plating liquid was 0° C. to 40° C.

Figure 7:
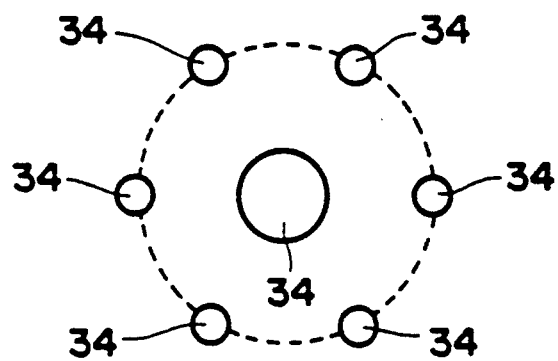
FIG. 7 is a schematic view for illustrating problems in the prior-art manufacturing method.
Figure 8:
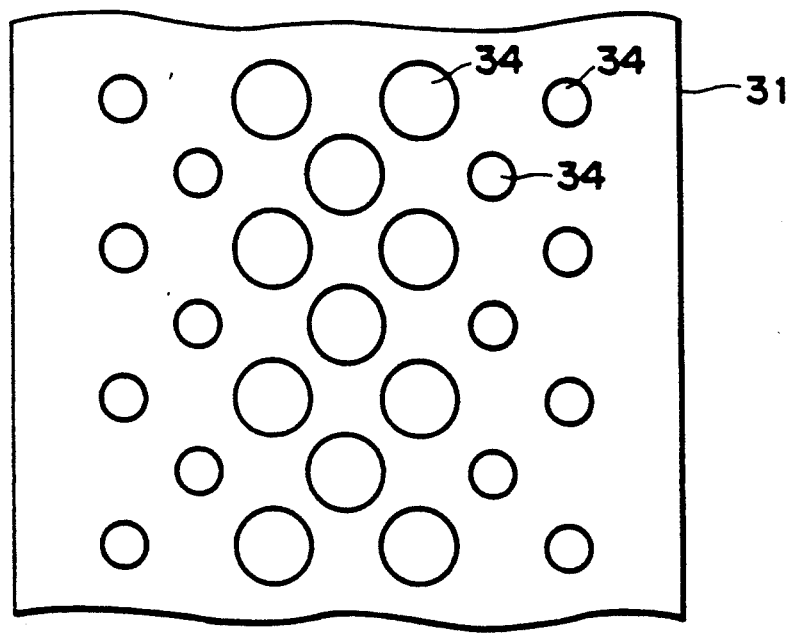
FIG. 8 is a schematic view for illustrating problems in the prior-art manufacturing method.

Further, in the case of a pattern comprising seven electrically conductive members (FIG. 7), the amount of protrusion of the seven electrically conductive members could also be made uniform by effecting similar adjustment by the manufacturing method of the present embodiment.

Figure 1A:
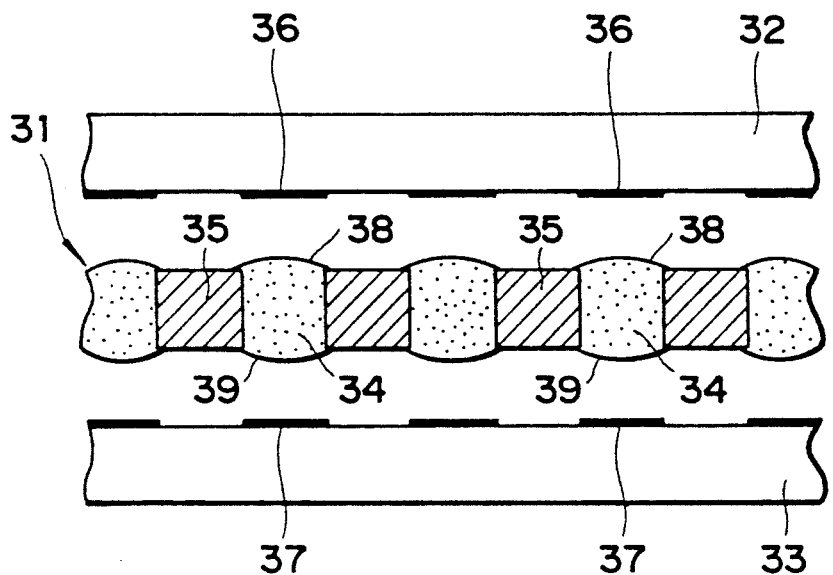
FIGS. 1A and 1B are schematic views showing an example of the use of an electrical connecting member.
Figure 1B:
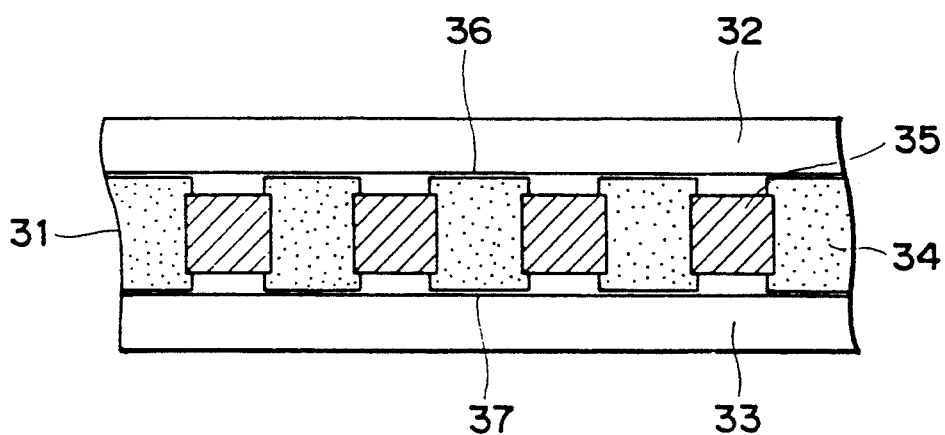
Figure 2A:
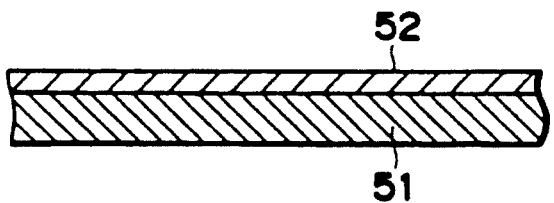
FIGS. 2A-2E are schematic cross-sectional views showing the steps of a prior-art manufacturing method.
Figure 2B:
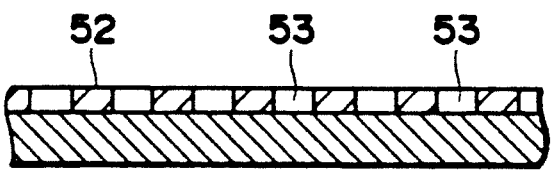
Figure 2C:
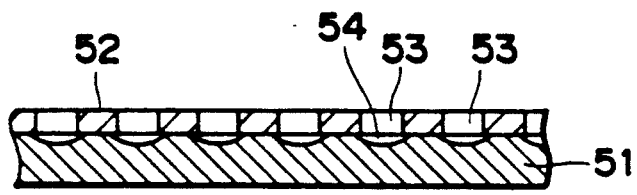
Figure 2D:
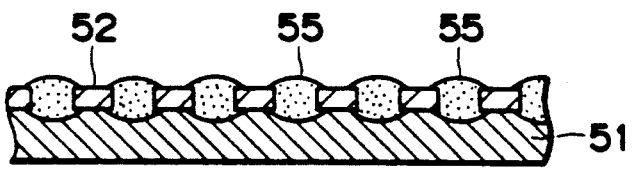
Figure 2E:
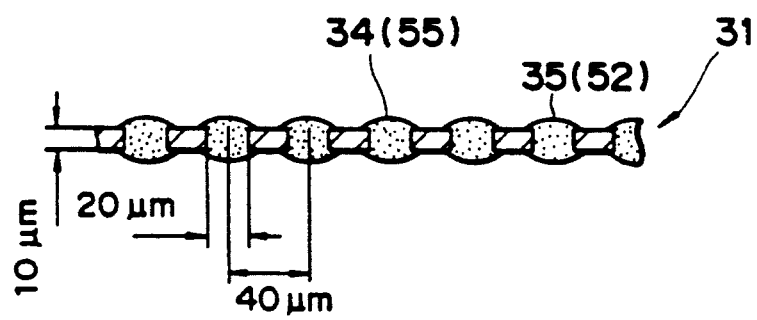
Figure 3:
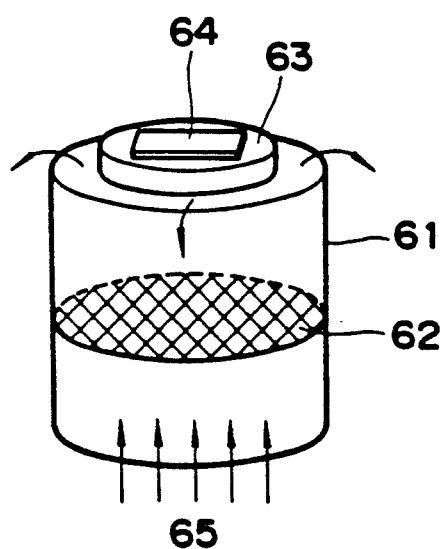
FIG. 3 is a schematic view showing a state in which the plating process is carried out.
Figure 4:
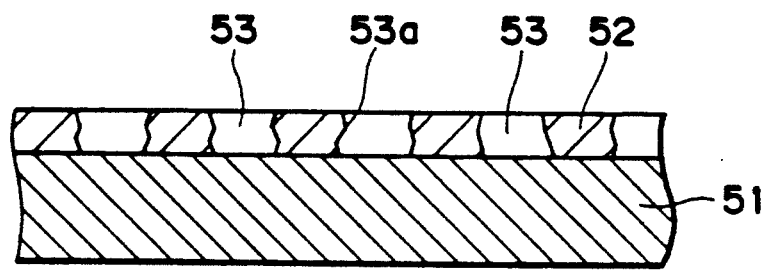
FIG. 4 is a schematic cross-sectional view showing a part of the manufacturing step for illustrating problems peculiar to the prior-art manufacturing method.
Figure 5A:
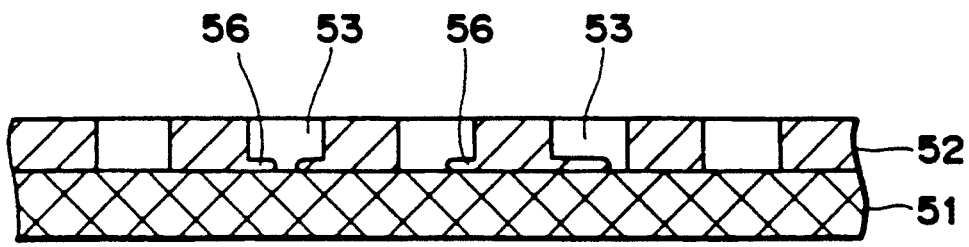
FIGS. 5A-5C are schematic cross-sectional views showing cases where the prior-art manufacturing method is inconvenient.
Figure 5B:
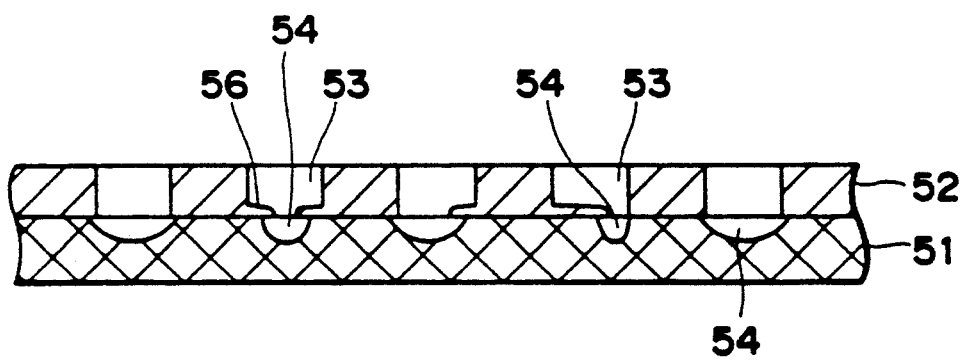
Figure 5C:
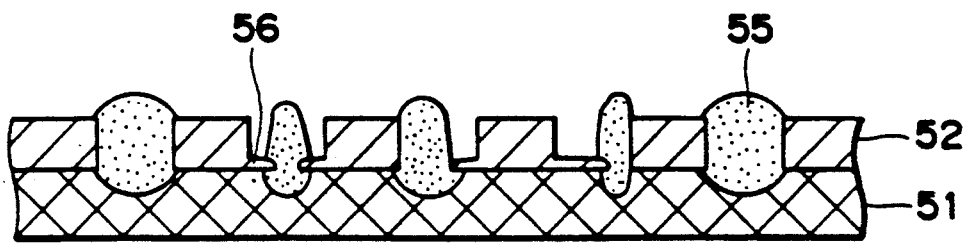

Subsequently, the apertures 104 and recesses 105 are filled with gold 106 by electroplating (FIG. 9D). For example, by the use of the apparatus of FIG. 3, the recesses 105 and apertures 104 are filled with gold 106 until bumps are formed. Finally, the copper plate 101 is dissolved and removed by the use of etching liquid which etches copper but does not etch gold and polyimide resin, thereby manufacturing an electrical connecting member 31 (FIG. 2E). In the electrical connecting member 31 manufactured in this manner, the gold 106 constitutes the electrically conductive members 34 (FIG. 2E) and the polyimide resin 102 constitutes the holding member 35 (FIG. 2E).

In the present embodiment, the polyimide resin 102 is used as photosensitive resin which provides the holding member, but use may also be made of any other photosensitive resin such as epoxy resin or silicone resin. Further, the copper plate 101 is used as the base body, whereas this is not restrictive, but other metal or an alloy can also be used. However, since in the final step, only the base body is selectively removed by etching, it is necessary to make the material of the electrically conductive members 34 and the material of the base body different from each other.

Also, in the present embodiment, photosensitive resin such as polyimide resin is used as the holding member, whereas this is not restrictive, but use may be made of any photosensitive resin. Also, one or more of inorganic materials, metal materials and alloy materials in a desired form of powder, fiber, a plate-like body, a bar-like body, a spherical body or the like may be dispersed and contained in photosensitive resin. As the metal material and alloy material contained, mention may be made of Au, Ag, Cu, Al, Be, Ca, Mg, Mo, Fe, Ni, Co, Mn, W, Cr, Nb, Zr, Ti, Ta, Zn, Sn, Pb-Sn, etc., and as the inorganic materials contained, mention may be made of ceramics such as $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, $P_2O_5$, $TiO_2$, MgO, SiC, BeO, BP, BN, AlN, $B_4C$, TaC, $TiB_2$, $CrB_2$, TiN, $Si_3N_4$ and $Ta_2O_5$, diamond, glass, carbon, boron, etc.

Further, gold is used as the material of the electrically conductive members 106, but instead of gold, use may be made of a metallic simple substance such as Cu, Ag, Be, Ca, Mg, Mo, Ni, W, Fe, Ti, In, Ta, Zn, Al, Sn or Pb-Sn, or an alloy of these. The cross-sectional shape of the electrically conductive members 106 can be circular, square or other shapes, but to avoid the excessive concentration of stress, rounded shapes are desirable.

The electrically conductive members 106 need not be vertically disposed in the holding member, but may be oblique from one surface side of the holding member to the other surface side of the holding member.

As described above, the manufacturing method of the present embodiment can expedite the circulation of the developing liquid in the apertures and effectively remove the residue in the apertures and thus, can make the shape of the apertures and the exposed shape of the surface of the base body exposed in the apertures uniform and can achieve the uniformity of the shape of the recesses formed in the base body and further the shape of the electrically conductive members, thereby achieving excellent effects such as the stabilization of the characteristic and the improved yield of product.

As described in detail above, the manufacturing method of the present embodiment leaves the intermediate member after the developing step in a heated atmosphere and/or a negative pressure atmosphere for a predetermined time, and heats and cure it after evaporation-removing the developing liquid which has infiltrated into photosensitive resin and therefore, can form a number of apertures each forming a predetermined shape in the photosensitive resin, thus manufacturing an electrical connecting member in which the shape of all electrically conductive members is uniform. As a result, the manufacturing method of the present embodiment achieves excellent effects such as the capability of manufacturing an electrical connecting member having electrically conductive members provided therein at high density, and the possibility of high-density connection of electric circuit parts.

As described above, in the gold protrusion forming method of the present embodiment, a bad shape resulting from a depression in the central portion of each protrusion or the lateral expanse toward the marginal portion of each protrusion can be avoided and thus, there can be formed gold protrusions of a very good shape.

As described in detail above, according to the manufacturing method of the present embodiment, the temperature of the plating liquid, the flow velocity of the plating liquid and the current density are adjusted in the electroplating step and therefore, there can be manufactured an electrical connecting member in which the influence of the current density distribution is prevented and which has a plurality of electrically conductive members having equal amounts of protrusion provided over the whole area, and as a result, there can be achieved an excellent effect such as the capability of greatly improving the manufacturing efficiency.

Thus, according to the present invention, there can be provided an electrical connecting member capable of connecting electric circuit parts together well and a method of manufacturing the same.

What is claimed is:

1. A method of manufacturing an electrical connecting member having a holding member having an electrically insulative material, and a plurality of electrically conductive members provided in a mutually insulated state in said holding member, one end of each of said electrically conductive members being exposed on one surface of said holding member and the other end of each of said electrically conductive members being exposed on the other surface of said holding member, said method including the steps of:
   providing photosensitive resin which provides said holding member on a base body;
   applying light to said photosensitive resin through a photomask forming a predetermined pattern to thereby expose said photosensitive resin to the light;
   developing said photosensitive resin to form a plurality of apertures in said photosensitive resin, thereby exposing said base body;
   leaving said photosensitive resin through which said base body has been exposed in a heated atmosphere and/or a negative pressure atmosphere for a predetermined time;
   etching the exposed portions of said base body to thereby form recesses communicating with said apertures;
   filling said apertures and said recesses with an electrically conductive material which provides said electrically conductive members; and
   removing the remaining portions of said base body.

2. A method according to claim 1, wherein said electrically conductive members constitute electrical connecting portions to be connected to the connecting portions of electric circuit parts, and said connecting portions and said electrical connecting portions are metallurgically connected together.

3. A method according to claim 1, wherein a wiring pattern is formed on one or each of the surfaces of said holding member.

4. A method according to claim 1, wherein the step of filling said apertures and said recesses with said electrically conductive material is the step of electroplating said electrically conductive material with the diameter of said apertures being equal to or greater than 10 $\mu$m and equal to or less than 150 $\mu$m, the Reynolds number of liquid flow imparted to plating liquid being a laminar flow equal to or greater than 50 and equal to or less than 450, and current density imparted to between two electrodes being equal to or greater than 1 mA/cm$^2$ and equal to or less than 5 mA/cm$^2$.

5. A method according to claim 4, wherein the step of filling said apertures and said recesses with said electrically conductive material is the step of electroplating said electrically conductive material by the use of plating having 30 ppm to 100 ppm of Tl or 30 ppm to 500 ppm of As added as an additive thereto.

6. A method according to claim 1, wherein the step of filling said apertures and said recesses with said electrically conductive material is a step which satisfies at least one of the condition that plating liquid shall be at 0° C. to 40° C., the condition that the flow velocity of the plating liquid shall be made variable in conformity with the growth of said electrically conductive material by plating, and the condition that the current density of the plating liquid shall be made variable in conformity with the growth of said electrically conductive material by plating.

7. A method of manufacturing an electrical connecting member having a holding member having an electrically insulative material, and a plurality of electrically conductive members provided in a mutually insulated state in said holding member, one end of each of said electrically conductive members being exposed on one surface of said holding member and the other end of each of said electrically conductive members being exposed on the other surface of said holding member, said method including the steps of:
   providing photosensitive resin which provides said holding member on a base body;
   applying light to said photosensitive resin through a photomask forming a predetermined pattern to thereby expose said photosensitive resin to the light;
   intermittently injecting developing liquid to the surface of said photosensitive resin while rotating and/or revolving said photosensitive resin, to thereby forming a plurality of apertures through which the surface of said base body is exposed;
   etching the exposed portions of said base body to thereby form recesses communicating with said apertures;
   filling said apertures and said recesses with an electrically conductive material which provides said electrically conductive members; and
   removing the remaining portions of said base body.

8. A method according to claim 7, wherein said electrically conductive members constitute electrical connecting portions to be connected to the connecting portions of electric circuit parts, and said connecting portions and said electrical connecting portions are metallurgically connected together.

9. A method according to claim 7, wherein a wiring pattern is formed on one or each of the surfaces of said holding member.

10. A method according to claim 7, wherein the step of filling said apertures and said recesses with said electrically conductive material is the step of electroplating said electrically conductive material with the diameter of said apertures being equal to or greater than 10 μm and equal to or less than 150 μm, the Reynolds number of liquid flow imparted to plating liquid being a laminar flow equal to or greater than 50 and equal to or less than 450, and current density imparted to between two electrodes being equal to or less than 5 mA/cm$^2$.

11. A method according to claim 10, wherein the step of filling said apertures and said recesses with said electrically conductive material is the step of electroplating said electrical conductive material by the use of plating liquid having 30 ppm to 100 ppm of Tl or 30 ppm to 500 ppm of As added as an additive thereof.

12. A method according to claim 7, wherein the step of filling said apertures and said recesses with said electrically conductive material is a step which satisfies at least one of the condition that plating liquid shall be at 0° C. to 40° C., the condition that the flow velocity of the plating liquid shall be made variable in conformity with the growth of said electrically conductive material by plating, and the condition that the current density of the plating liquid shall be made variable in conformity with the growth of said electrically conductive material by plating.

13. A method of manufacturing an electrical connecting member having a holding member having an electrically insulating material, and a plurality of electrically conductive members provided in a mutually insulated state in said holding member, one end of each of said electrically conductive members being exposed on one surface of said holding member and the other end of each of said electrically conductive members being exposed on the other surface of said holding member, said method including the steps of:

providing photosensitive resin which provides said holding member on a base body;

applying light to said photosensitive resin through a photomask forming a predetermined pattern to thereby expose said photosensitive resin to the light;

injecting developing liquid and gas to the surface of said photosensitive resin at a time or alternately to thereby form a plurality of apertures through which the surface of said base body is exposed;

etching the exposed portions of said base body to thereby form recesses communicating with said apertures;

filling said apertures and said recesses with an electrically conductive material which provides said electrically conductive members; and removing the remaining portions of said base body.

14. A method according to claim 13, wherein said electrically conductive members constitute electrical connecting portions to be connected to the connecting portions of electric circuit parts, and said connecting portions and said electrical connecting portions are metallurgically connected together.

15. A method according to claim 13, wherein a wiring pattern is formed on one or each of the surfaces of said base body.

16. A method according to claim 13, wherein the step of filling said apertures and said recesses with said electrically conductive material is the step of electroplating said electrically conductive material with the diameter of said apertures being equal to or greater than 10 μm and equal to or less than 150 μm, the Reynolds number of liquid flow imparted to plating liquid being a laminar flow equal to or greater than 50 and equal to or less than 450, and current density imparted to between two electrodes being equal to or greater than 1 mA/cm$^2$ and equal to or less than 5 mA/cm$^2$.

17. A method according to claim 16, wherein the step of filling said apertures and said recesses with said electrically conductive material is the step of electroplating said electrically conductive material by the use of plating liquid having 30 ppm to 100 ppm of Tl or 30 ppm to 500 ppm of As added as an additive thereof.

18. A method according to claim 13, wherein the step of filling said apertures and said recesses with said electrically conductive material is a step which satisfies at least one of the condition that plating liquid shall be at 0° C. to 40° C., the condition that the flow velocity of the plating liquid shall be made variable in conformity with the growth of said electrically conductive material by plating, and the condition that the current density of the plating liquid shall be made variable in conformity with the growth of said electrically conductive material by plating.

19. A method of manufacturing an electrical connecting member having a holding member having an electrically insulative material, and a plurality of electrically conductive members provided in a mutually insulated state in said holding member, one end of each of said electrically conductive members being exposed on one surface of said holding member and the other surface of each of said electrically conductive members being exposed on the other surface of said holding member, said method including the steps of:

providing photosensitive resin which provides said holding member on a base body;

applying light to said photosensitive resin through a photomask forming a predetermined pattern to thereby expose said photosensitive resin to the light;

propagating an ultrasonic wave through said photosensitive resin while injecting developing liquid to the surface of said photosensitive resin, thereby forming a plurality of apertures through which said base body is exposed;

etching the exposed portions of said base body to thereby form recesses communicating with said apertures;

filling said apertures and said recesses with an electrically conductive material which provides said electrically conductive members; and removing the remaining portions of said base body.

20. A method according to claim 19, wherein said ultrasonic wave is equal to or greater than 20 KHz and equal to or less than 10 MHz.

21. A method according to claim 19, wherein said electrically conductive members constitute electrical connecting portions to be connected to the connecting portions of electric circuit parts, and said connecting portions and said electrical connecting portions are metallurgically connected together.

22. A method according to claim 19, wherein a wiring pattern is formed on one or each of the surfaces of said holding member.

23. A method according to claim 19, wherein the step of filling said apertures and said recesses with said electrically conductive material is the step of electroplating said electrically conductive material with the diameter of said apertures being equal to or greater than 10 μm and equal to or less than 150 μm, the Reynolds number of liquid flow imparted to plating liquid being a laminar flow equal to or greater than 50 and equal to or less than 450, and current density imparted to between two electrodes being equal to or greater than 1 mA/cm$^2$ and equal to or less than 5 mA/cm$^2$.

24. A method according to claim 23, wherein the step of filling said apertures and said recesses with said electrically conductive material is the step of electroplating said electrically conductive material by the use of plating liquid having 30 ppm to 100 ppm of Tl or 30 ppm to 500 ppm of As added as an additive thereto.

25. A method according to claim 19, wherein the step of filling said apertures and said recesses with said electrically conductive material is a step which satisfies at least one of the condition that plating liquid shall be at 0° C. to 40° C., the condition that the flow velocity of the plating liquid shall be made variable in conformity with the growth of said electrically conductive material by plating, and the condition that the current density of the plating liquid shall be made variable in conformity with the growth of said electrically conductive material by plating.

26. A method of manufacturing an electrical connecting member having a holding member having an electrically insulative material, and a plurality of electrically conductive members provided in a mutually insulated state in said holding member, one end of each of said electrically conductive members being exposed on one surface of said holding member and the other end of each of said electrically conductive members being exposed on the other surface of said holding member, said method including the steps of:
    providing photosensitive resin which provides said holding member on a base body;
    applying light to said photosensitive resin through a photomask forming a predetermined pattern to thereby expose said photosensitive resin to the light;
    propagating an ultrasonic wave through said photosensitive resin while injecting developing liquid to the surface of said photosensitive resin, thereby forming a plurality of apertures through which said base body is exposed;
    etching the exposed portions of said base body to thereby form recesses communicating with said apertures;
    filling said apertures and said recesses with an electrically conductive material which provides said electrically conductive members, this step being the step of electroplating said electrically conductive material with the diameter of said apertures being equal to or greater than 10 μm and equal to or less than 150 μm, the Reynolds number of liquid flow imparted to plating liquid being a laminar flow equal to or greater than 50 and equal to or less than 450, and current density imparted to between two electrodes being equal to or greater than 1 mA/cm$^2$ and equal to or less than 5 mA/cm$^2$; and
    removing the remaining portions of said base body.

27. A method according to claim 26, wherein the step of electroplating said electrically conductive material uses plating liquid having 30 ppm to 100 ppm of Tl or 30 ppm to 500 ppm of As added as an additive thereto.

28. A method according to claim 26, wherein said electrically conductive members constitute electrical connecting portions to be connected to the connecting portions of electric circuit parts, and said connecting portions and said electrical connecting portions are metallurgically connected together.

29. A method according to claim 26, wherein a wiring pattern is formed on one or each of the surfaces of said holding member.

30. A method of manufacturing an electrical connecting member having a holding member having an electrically insulative material, and a plurality of electrically conductive members provided in a mutually insulated state in said holding member, one end of each of said electrically conductive members being exposed on one surface of said holding member and the other end of each of said electrically conductive members being exposed on the other surface of said holding member, said method including the steps of:
    providing photosensitive resin which provides said holding member on a base body;
    applying light to said photosensitive resin through a photomask forming a predetermined pattern to thereby expose said photosensitive resin to the light;
    propagating an ultrasonic wave through said photosensitive resin while injecting developing liquid to the surface of said photosensitive resin, thereby forming a plurality of apertures through which said base body is exposed;
    etching the exposed portions of said base body to thereby form recesses communicating with said apertures;
    filling said apertures and said recesses with an electrically conductive material which provides said electrically conductive members, this step being a step which satisfies at least one of the condition that plating liquid shall be at 0° C. to 40° C., the condition that the flow velocity of the plating liquid shall be made variable in conformity with the growth of said electrically conductive material by plating, and the condition that the current density of the plating liquid shall be made variable in conformity with the growth of said electrically conductive material by plating; and
    removing the remaining portions of said base body.

31. A method according to claim 30, wherein said exposed photosensitive resin has its surface facing downward, and the developing liquid is injected from below said photosensitive resin.

32. A method according to claim 30, wherein said electrically conductive members constitute electrical connecting portions to be connected to the connecting portions of electric circuit parts, and said connecting portions and said electrical connecting portions are metallurgically connected together.

33. A method according to claim 30, wherein a wiring pattern is formed on one or each of the surfaces of said holding member.

34. A method of manufacturing an electrical connecting member having a holding member having an electrically insulative material, and a plurality of electrically conductive members provided in a mutually insulated state in said holding member, one end of each of said electrically conductive members being exposed on one surface of said holding member and the other end of each of said electrically conductive members being exposed on the other surface of said holding member, said method including the steps of:
    providing photosensitive resin which provides said holding member on a base body;

applying light to said photosensitive resin through a photomask forming a predetermined pattern to thereby expose said photosensitive resin to the light;

propagating an ultrasonic wave through said photosensitive resin while injecting developing liquid to the surface of said photosensitive resin, thereby forming a plurality of apertures through which said base body is exposed;

etching the exposed portions of said base body to thereby form recesses communicating with said apertures;

filling said apertures and said recesses with an electrically conductive material which provides said electrically conductive members, this step being the step of effecting electroplating by the use of plating liquid having 30 ppm to 100 ppm of Tl or 30 ppm to 500 ppm of As added as an additive thereto with the diameter of said apertures being equal to or greater than 10 $\mu$m and equal to or less than 150 $\mu$m, the Reynolds number of liquid flow imparted to the plating liquid being a laminar flow equal to or greater than 50 and equal to or less than 450, and current density imparted to between two electrodes being equal to or greater than 1 mA/cm$^2$ and equal to or less than 5 mA/cm$^2$; and removing the remaining portions of said base body.

35. A method according to claim 34, wherein said electrically conductive members constitute electrical connecting portions to be connected to the connecting portions of electric circuit parts, and said connecting portions and said electrical connecting portions are metallurgically connected together.

36. A method according to claim 34, wherein a wiring pattern is formed on one or each of the surfaces of said holding member.

37. A method according to claim 34, wherein the step of filling said apertures and said recesses with said electrically conductive material is a step which satisfies at least one of the condition that the plating liquid shall be at 0° C. to 40° C., the condition that the flow velocity of the plating liquid shall be made variable in conformity with the growth of said electrically conductive material by plating, and the condition that the current density of the plating liquid shall be made variable in conformity with the growth of said electrically conductive material by plating.

* * * * *

UNITED STATES PATENT AND TRADEMARK OFFICE
CERTIFICATE OF CORRECTION

PATENT NO. : 5,323,535
DATED : June 28, 1994
INVENTOR(S) : TAKASHI SAKAKI, ET AL.

Page 1 of 3

It is certified that error appears in the above-identified patent and that said Letters Patent is hereby corrected as shown below:

ON TITLE PAGE

In [56] References Cited, under OTHER PUBLICATIONS:
"Development Index" should read --Development Index,--.

COLUMN 2

Line 18, "a" (second occurrence) should read --as--.
Line 41, "manufacture an" should read --manufactured an--.

COLUMN 4

Line 13, "teces" should read --tices--.

COLUMN 7

Line 15, "photo-sensi-" should read --photosensi- --.
Line 16, "turn table" should read --turntable--.
Line 20, "turn table" should read --turntable--.
Line 21, "turn table" should read --turntable--.
Line 40, "60-second's" should read --60-seconds'--.
Line 41, "5-second's" should read --5-seconds'--.
Line 42, "30-second's" should read --30-seconds'--.
Line 43, "second's" should read --seconds'--.
Line 50, "upper plate 101" should read --copper plate 101--.
Line 51, "turn table" should read --turntable--.
Line 54, "turn table," should read --turntable,--.
Line 55, "turn table" should read --turntable--.
Line 56, "turn" should read --turn- --.

UNITED STATES PATENT AND TRADEMARK OFFICE
CERTIFICATE OF CORRECTION

PATENT NO. : 5,323,535

DATED : June 28, 1994

INVENTOR(S) : TAKASHI SAKAKI, ET AL.

It is certified that error appears in the above-identified patent and that said Letters Patent is hereby corrected as shown below:

COLUMN 8

Line 14, "turn table" should read --turntable--.
Line 15, "turn table" should read --turntable--.
Line 23, "turn" should read --turn- --.
Line 28, "turn table" should read --turntable--.
Line 63, "after greatly" should read --after being greatly--.
Line 68, "intermediate member" should read --intermediate member 110--.

COLUMN 9

Line 15, "small than" should read --smaller than--.
Line 25, "intermediate member" should read --intermediate member 110--.
Line 50, "uniformize" should read --make uniform--.
Line 60, "gold-lated" should read --gold-plated--.

COLUMN 11

Line 49, "grater" should read --greater--.
Line 55, "the" should be deleted.
Line 64, "that" should read --those--.

COLUMN 12

Line 11, "of 105:" should read --of recesses 105:--.

COLUMN 14

Line 64, "cure" should read --cures--.
Line 66, "therefore," should read --, therefore,--.

UNITED STATES PATENT AND TRADEMARK OFFICE
CERTIFICATE OF CORRECTION

PATENT NO. : 5,323,535
DATED : June 28, 1994
INVENTOR(S) : TAKASHI SAKAKI, ET AL.

Page 3 of 3

It is certified that error appears in the above-identified patent and that said Letters Patent is hereby corrected as shown below:

COLUMN 15

Line 20, "therefore," should read --, therefore,--.

COLUMN 16

Line 19, "ing having" should read --ing liquid having--.
Line 51, "forming" should read --form--.

COLUMN 17

Line 14, "electrical" should read --electrically--.

Signed and Sealed this

Twenty-eight Day of February, 1995

Attest:

BRUCE LEHMAN

Attesting Officer    Commissioner of Patents and Trademarks